United States Patent
Ando et al.

(10) Patent No.: US 7,063,742 B1
(45) Date of Patent: Jun. 20, 2006

(54) N-TYPE SEMICONDUCTOR DIAMOND AND ITS FABRICATION METHOD

(75) Inventors: Toshihiro Ando, Ibaraki (JP); Yoichiro Sato, Ibaraki (JP); Eiji Yasu, Ibaraki (JP); Mika Gamo, Ibaraki (JP); Isao Sakaguchi, Ibaraki (JP)

(73) Assignee: Japan Science and Technology Agency, Saitama-Ken (JP)

( * ) Notice: Subject to any disclaimer, the term of this patent is extended or adjusted under 35 U.S.C. 154(b) by 0 days.

(21) Appl. No.: 09/926,188

(22) PCT Filed: Mar. 27, 2000

(86) PCT No.: PCT/JP00/01863

§ 371 (c)(1),
(2), (4) Date: Sep. 20, 2001

(87) PCT Pub. No.: WO00/58534

PCT Pub. Date: Oct. 5, 2000

(30) Foreign Application Priority Data

Mar. 26, 1999 (JP) .......................... 11-124682

(51) Int. Cl.
*C30B 29/04* (2006.01)

(52) U.S. Cl. .................. 117/101; 117/92; 117/94; 117/103; 117/929; 117/902

(58) Field of Classification Search .................. 117/101, 117/92, 94, 103, 902, 929
See application file for complete search history.

(56) References Cited

U.S. PATENT DOCUMENTS

| | | | | |
|---|---|---|---|---|
| 5,001,452 A | * | 3/1991 | Imai et al. ........... | 257/E29.082 |
| 5,474,021 A | * | 12/1995 | Tsuno et al. ................ | 117/101 |
| 5,500,077 A | * | 3/1996 | Nishibayashi et al. ........ | 216/38 |
| 5,977,697 A | * | 11/1999 | Jin et al. ..................... | 313/310 |

FOREIGN PATENT DOCUMENTS

| | | |
|---|---|---|
| JP | 63-302516 | 12/1988 |
| JP | 01-103994 | * 4/1989 |
| JP | 02-263791 | * 10/1990 |
| JP | 5-017291 | 1/1993 |
| JP | 5-024989 | 2/1993 |
| JP | 10-194889 | 7/1998 |

OTHER PUBLICATIONS

Schreiber Translations, Inc. English Translation of JP 01–103994 (2002) pp 1–8.*
Patent Abstracts of Japan of JP 01–103994. "Method of growing Diamond Single crystal". Apr. 21, 1989.*
Patent Abstracts of Japan of JP 02–263791. "Production of Diamond Film" Oct. 26, 1990.*
A. B. Anderson et al., "*Molecular–Orbital Theory of Monatomic and Diatomic Substitutional Defects as Shallow N–Type Dopants in Diamond*", Physical Review B, vol. 54, No. 20, Nov. 1996, pp. 14341–14348.

(Continued)

*Primary Examiner*—Nadine G. Norton
*Assistant Examiner*—Matt Song
(74) *Attorney, Agent, or Firm*—Westerman, Hattori, Daniels & Adridan, LLP

(57) ABSTRACT

A substrate is polished and made an inclined substrate, which is exposed to a hydrogen plasma and is thereby smoothened. The substrate is then heated controlledly until it surface temperature reaches 830° C. Meanwhile, a gas mixture of 1% methane, 50 ppm hydrogen sulfide and hydrogen is introduced in a tubular reaction vessel to flow therethrough at 200 ml/min, where microwave plasma is excited to cause n-type semiconductor diamond to epitaxially grow on the substrate. An ion doped n-type semiconductor is thus formed that has a single donor level of an activation energy at 0.38 eV and is high in mobility and of high quality.

6 Claims, 13 Drawing Sheets

(1 of 13 Drawing Sheet(s) Filed in Color)

OTHER PUBLICATIONS

B. V. Spitsyn, "*Chemical Aspects of Diamond Doping*", NATO ASI Series (Wide Band Gap Electronic Materials), 3. High Technology, vol. 1, 1995, pp. 31–45.

Collins, Alan T., *The Electronic and Optical Properties of Diamond; Do They Favour Device Applications?*, Materials Reasearch Society Symposia Proceedings, 1990, vol. 162, pp. 3–14.

Fujimori et al, *Epitaxial Growth of Diamond and Diamond Devices*, Materials Research Society Symposia Proceedings, 1990, vol. 162, pp. 23–33.

Koizumi et al, *Growth and Characterization of Phosphorus dope n–type Diamond Thin Films*, Diamond and Related Materials 7 (1998) pp. 540–544.

* cited by examiner

| | |
|---|---|
| Gas source | $CH_4/H_2$ $S/H_2$ |
| $CH_4$ Concentration | 1.0% |
| $H_2S$ Concentration | 10~100ppm |
| S/C Ratio | 1000~10000ppm |
| Total gas flow rate | 200ml min$^{-1}$ |
| Gas pressure | 40Torr |
| Microwave | 2.45GHz, 300~400W |
| Substrate temperature | 830°C |
| Diamond substrate | HP-HT1b Diamond (100) |

FIG. 5

N-TYPE SEMICONDUCTOR DIAMOND AND ITS FABRICATION METHOD

TECHNICAL FIELD

This invention relates to an n-type semiconductor diamond that can be used in electronic devices such as a small, high power device, a high output, high frequency device and a radiation-resistant integrated circuit which has so far been impossible to realize with a conventional semiconductor, and more particularly to such a diamond with n-type conductivity and yet having high mobility and good crystallinity, as well as a method of its making. In particular, the invention relates to an n-type semiconductor diamond formed by adding donor atoms effectively to diamond and to a method of making the same.

BACKGROUND ART

Si semiconductor and gallium arsenide semiconductor are currently in use with the problem that micronizing and densifying these devices gives rise to a rise in electric field strength in their interior and heat buildup is encountered in their use. Henceforth these semiconductors will have to adapt themselves to meet severe environments.

In contrast, diamond is a wide band gap semiconductor, is the highest in the mobility of electrons and positive holes, is extremely high in breakdown electric field and yet is the least to produce electron and positive hole pairs at an elevated temperature or as influenced by a radiation. Diamond semiconductors, thus with the ability by nature to meet severe environments, are usable in high power, high frequency operating and high temperature operating devices. To realize such a diamond semiconductor device, thin films of diamond crystal of good quality are required.

So far, it has been possible to fabricate low resistance p-type semiconductor diamond by boron dopin with ease. As for low resistance n-type semiconductor diamond, however, it has practically been difficult to obtain a thin film of semiconductor diamond crystal of satisfactory quality, despite the studies that have been pursued to investigate into a large number of manufacturing processes including doping into CVD diamond.

For example, it has been reported that doping diamond with nitrogen reduces its activation energy and makes it an insulator at a room temperature (Mat. Res. Soc. Symp. Proc. 162, 3–14, 1990). Further, a thin film of n-type diamond crystal doped with phosphorus has been reported, which is too high in electrical resistivity, however, to the extent that it is unsuitable for practical use (Mat. Res. Soc. Symp. Proc. 162, 23–34, 1990).

Also, an experiment to obtain an n-type diamond thin film from methane and hydrogen sulfide by a microwave plasma CVD technique has been reported (JP P 63-302516 A). However, as is apparent from Tables 1 and 2 of this patent literature, the n-type semiconductor diamond thin film made using the microwave plasma CVD process has an electron mobility that is abnormally high compared with that of an n-type semiconductor diamond crystal made by an extra-high pressure process shown in Table 2 in spite of the fact that both have an equivalent sulfur concentration. That is to say, it is shown that this n-type semiconductor diamond thin film is deficient and not applicable in a semiconductor electronic device.

Further, in the fabrication of phosphorus doped diamond by the microwave plasma CVD technique, there have been known a phosphorus doping process that introduces phosphine into a reaction gas of hydrogen and hydrocarbon and decomposes phosphine in a microwave plasma, and another phosphorus doping process that decomposes phosphine at a high temperature or by irradiation with an ultraviolet ray.

However, the preceding microwave plasma CVD process because it dopes diamond with phosphorus in a state that it is combined with hydrogen will not make phosphorus a source of supply of electrons and, if phosphorus is doped, only yields n-type semiconductor diamond that is low in carrier mobility and deep in level. For these reasons, no n-type semiconductor of this type that is of the quality which makes it applicable to a semiconductor electronic device has been obtained.

Therefore, as far as the CVD technique is concerned, while thus far there have already been reports about methods tried to make a thin film of n-type semiconductor diamond as mentioned above, none has as yet been obtained thereby that is of a quality level enough to justify its use in a semiconductor electronic device.

Besides, a method has also been known that implants diamond with phosphorus ions accelerated. According to this method, phosphorus that is greater in mass than carbon is implanted, which creates a defect in diamond. Further, because phosphorus without combining with carbon is interstitially included in the diamond lattice, it is more than hard to create such a combination therein. Thus, any such n-type semiconductor of acceptable quality has not as yet been obtained by this method either.

Further, there has also been known the chemical transport reaction process that dopes diamond with phosphorus, which places graphite and red phosphorous in the reaction system and evaporates them in the system to synthesize diamond while doping it with phosphorus.

However, a difference in the rate of reaction and the rate of evaporation between graphite and red phosphorous makes it hard for the process to control the phosphorus concentration. Indeed, no such n-type semiconductor of satisfactory quality sought has been obtained by this process either.

Also, there has recently been proposed an n-type diamond semiconductor having atoms of a valence number of 5 or more added thereto as donor atoms. See JP P 10-194889 A. However, a phosphorus added n-type semiconductor diamond applicable to a semiconductor electronic device has remained unrealized and a method of its making has become a problem awaiting solution.

This invention is aimed to solve such problems encountered in the prior art and has for its first object to provide an n-type semiconductor diamond having a perfect crystallinity that is applicable to a semiconductor electronic device. The present invention also has for a second object to provide a method that enables making an n-type semiconductor diamond which having a perfect crystallinity is applicable to a semiconductor device.

SUMMARY OF THE INVENTION

In order to achieve the first object mentioned above, there is provided in accordance with the present invention, an n-type semiconductor diamond, characterized by: a crystalline perfectness whereby: it has impurity atoms constituted by sulfur atoms forming a single donor level of 0.38 EV, it has a carrier mobility's temperature dependency which at a temperature (T) range in excess of the room temperature is $T^{-3/2}$ dependent, and it has a diamond peak in its Raman spectrum, whose half-breadth is 2.6 cm$^{-1}$; a crystalline perfectness whereby: a light emission by excitons is observable; and a crystalline perfectness whereby: a distinct Kikuchi pattern in its reflection electron diffraction analysis is observable.

An n-type semiconductor diamond according to the present invention is made preferably to have at a room temperature, a carrier concentration not less than $1.4 \times 10^{13}$ cm$^{-3}$ and a carrier mobility not less than 580 cm$^2$V$^{-1}$s$^{-1}$.

An n-type semiconductor diamond according to the present invention that is thus high in crystalline perfectness can be combined with the conventional p-type semiconductor diamond fabrication technique to form an pn-junction having excellent electrical characteristics and is applicable to making a semiconductor electronic device.

In order to achieve the second object mentioned above, the present invention also provides a method of making an n-type semiconductor diamond, characterized in that it comprises: mechanically polishing a diamond substrate to make it an inclined substrate; subjecting a surface of the inclined substrate to a smoothening treatment to make it even; exciting a raw material gas made of a volatile hydrocarbon compound, a sulfur compound and a hydrogen gas by a microwave plasma while maintaining at a given temperature the substrate surface smoothened as aforesaid to cause n-type semiconductor diamond to grow epitaxially on the surface smoothened diamond substrate.

For the diamond substrate, use is made of a diamond (100) face oriented substrate.

Also, the inclined substrate surface is preferably formed to consist of steps each in the order of an atomic layer, by mechanically polishing a diamond (100) face oriented substrate so that its face normal is inclined at an angle in a range between 1.5 degree and 6 degrees with respect to its <100> direction in a plane made by either its <100> and <010> directions or its <100> and <001> directions.

Also, the hydrogen plasma exposure treatment preferably comprises a treatment of exposing the inclined substrate to the hydrogen plasma of a hydrogen pressure of 10 to 50 Torr and a microwave output of 200 to 1200 W at a substrate temperature of 700 to 1200° C. for a period of 0.5 hour to 5 hours, thereby to make even the substrate surface in the order of an atomic layer.

Such a treatment as mentioned above makes even the substrate surface in an atomic order and gives rise to a surface having (100) faces laid stepped consecutively each in the order of an atomic layer.

Also, the aforementioned given substrate temperature lies preferably in a range between 700 and 1100° C., more preferably at 830° C.

A method of making an n-type semiconductor diamond according to the present invention as described above enables making an n-type semiconductor diamond that has the n-type electrical conductivity, the characteristic found where carriers are supplied from a single donor level and that is large in mobility and has crystal defect reduced to minimum.

BRIEF DESCRIPTION OF THE DRAWINGS

This application contains at least one drawing executed in color. Copies of this patent or patent application publication with color drawing(s) will be provided by the Office upon request and payment of the necessary fee.

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

Figure 1A:
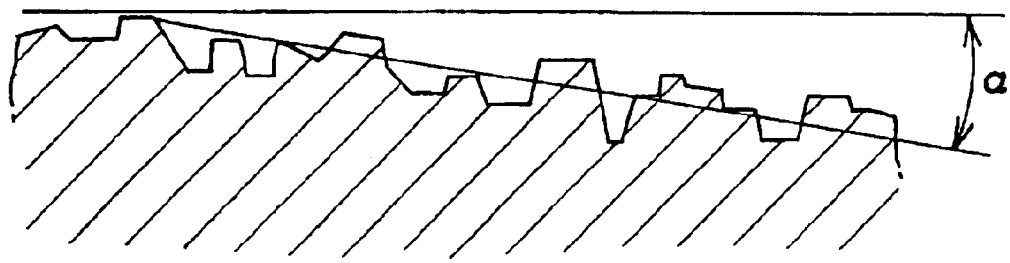
Figure 4:
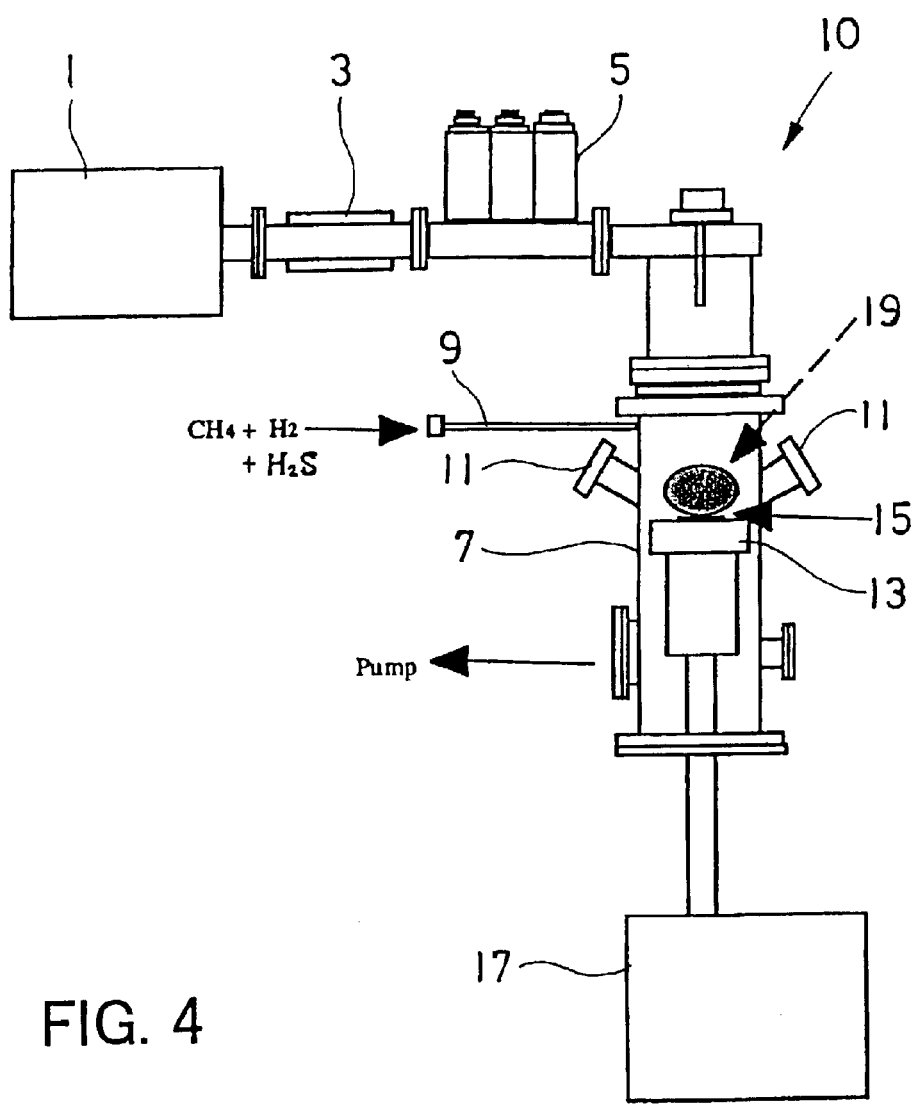
Figure 6:
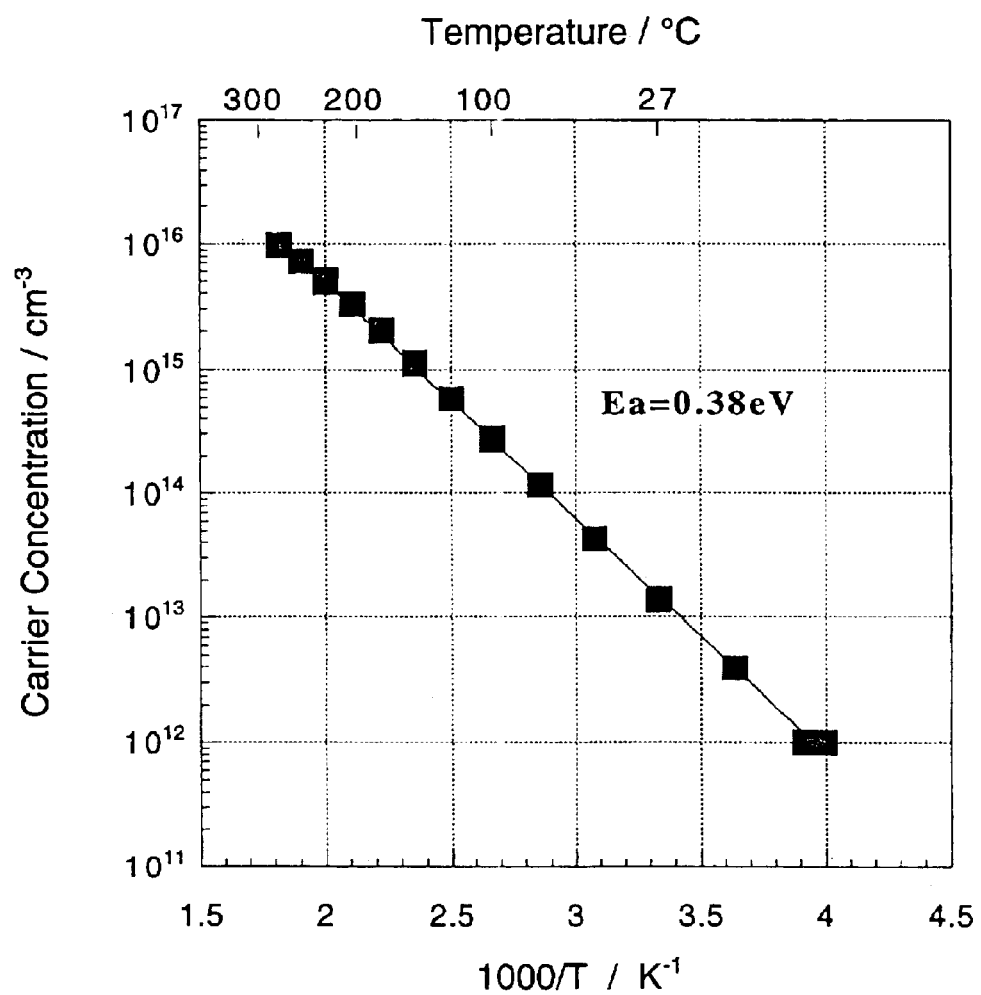
Figure 7:
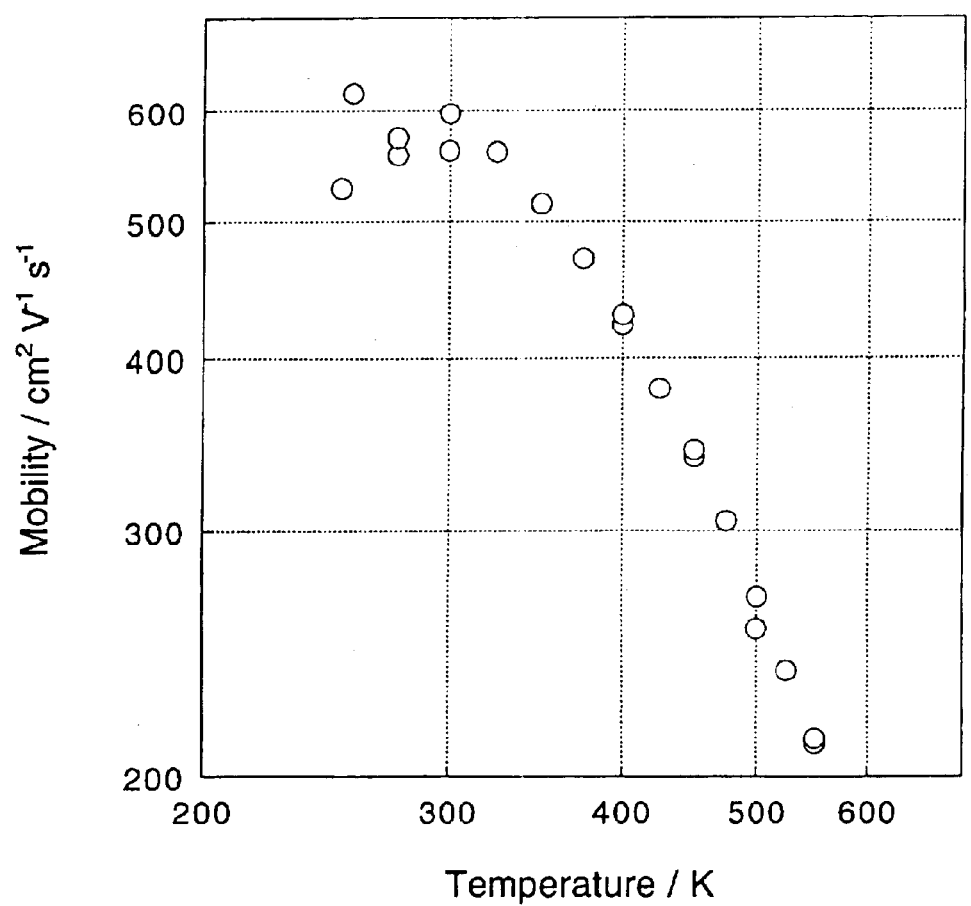
Figure 8:
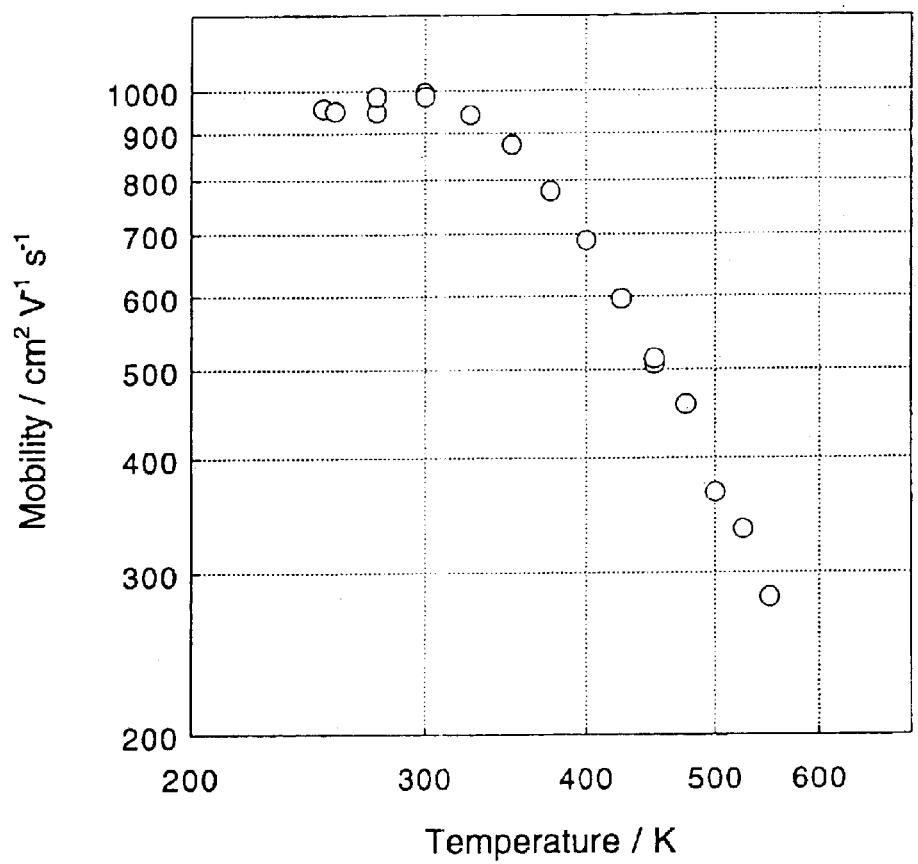
Figure 9:
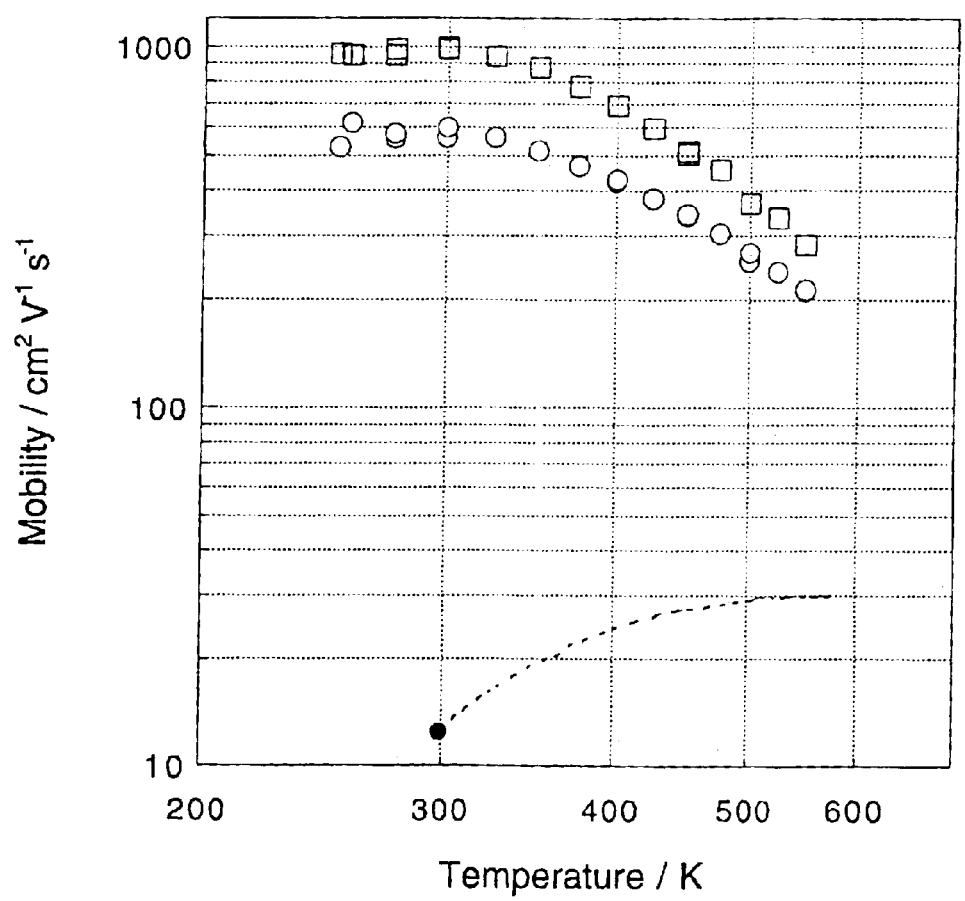
Figure 10:
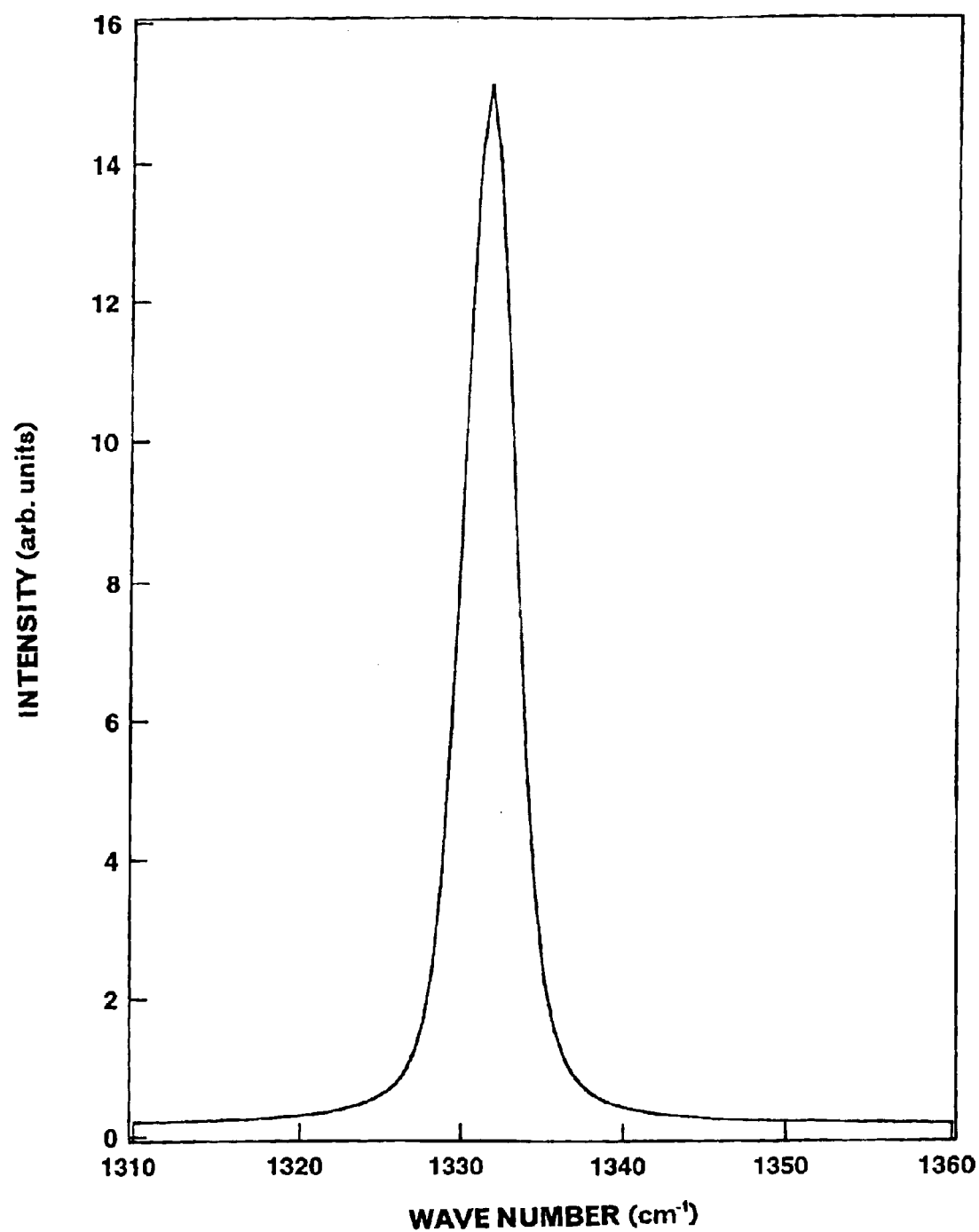
Figure 11:
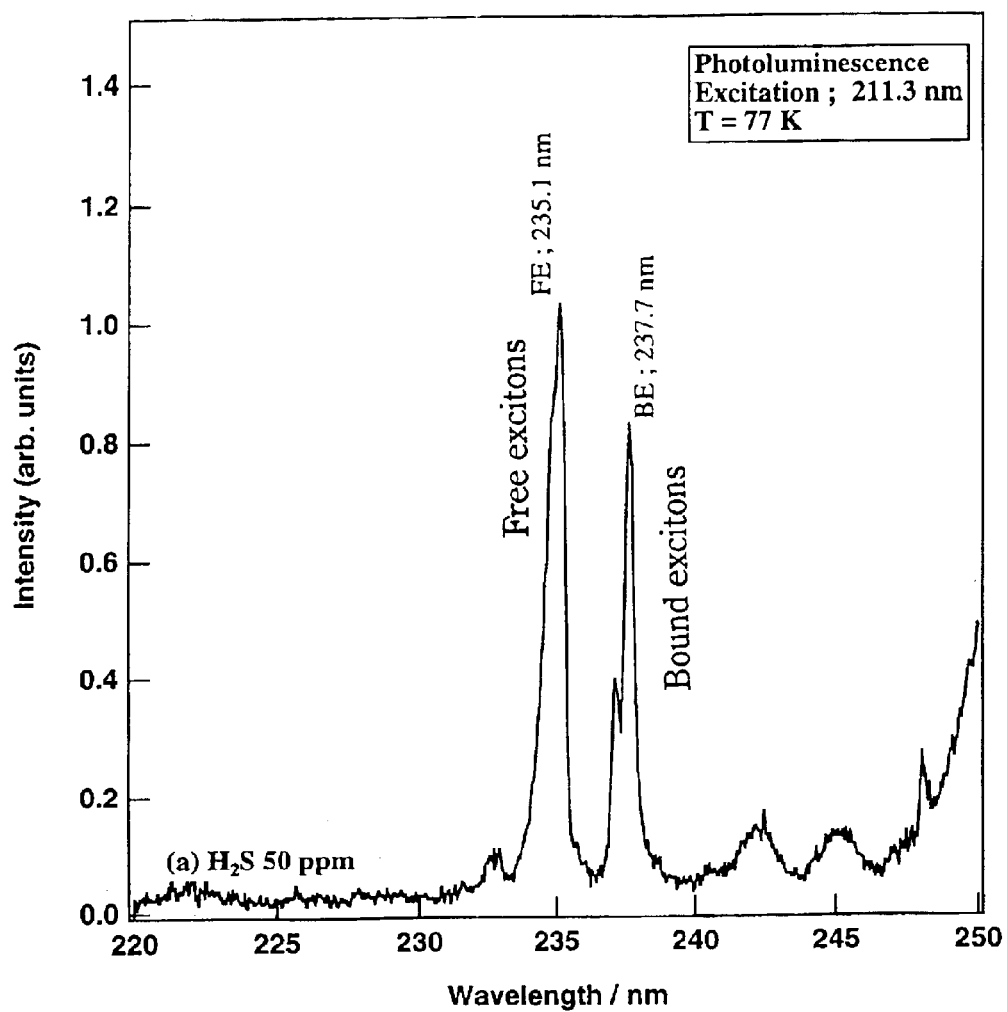
Figure 12A:
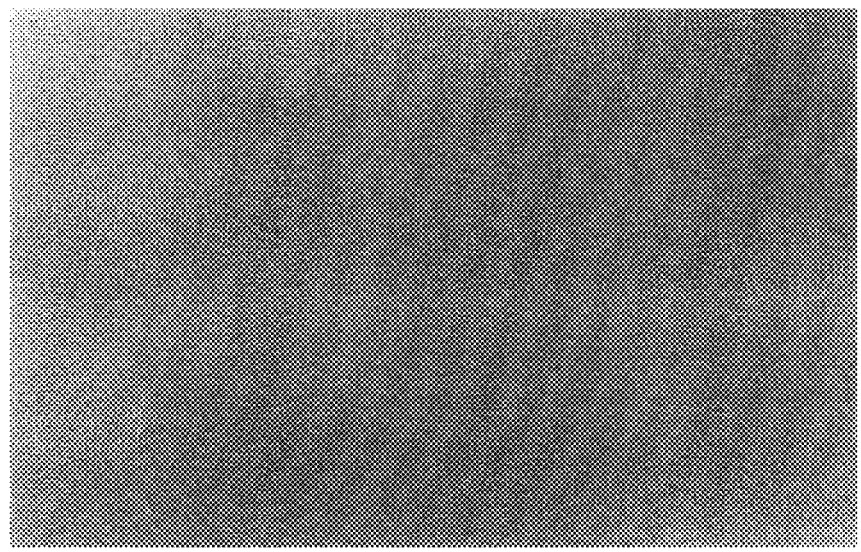
Figure 12B:
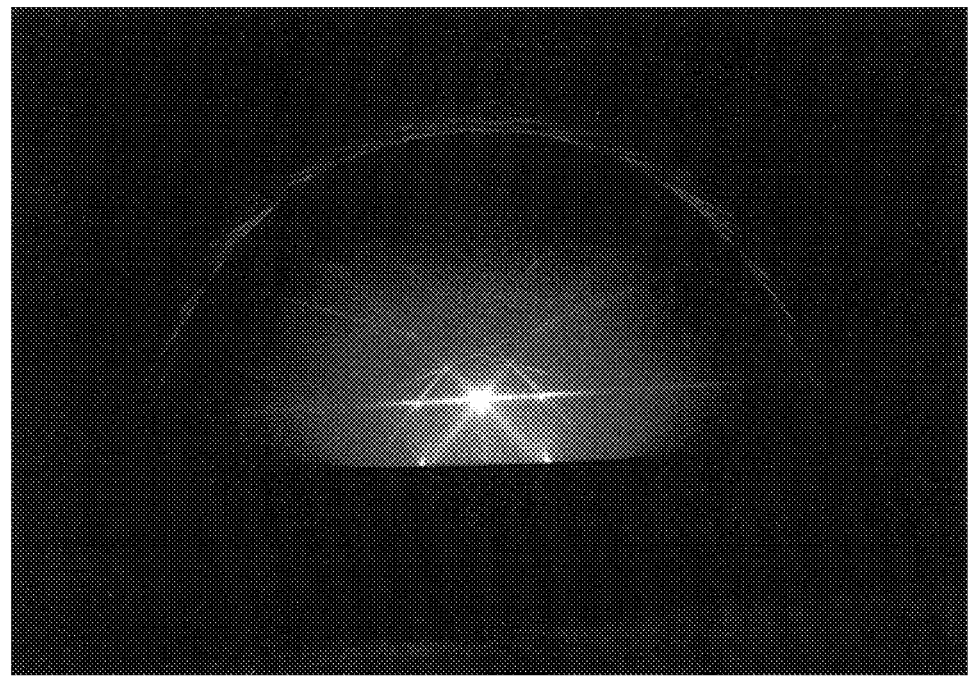
Figure 13:
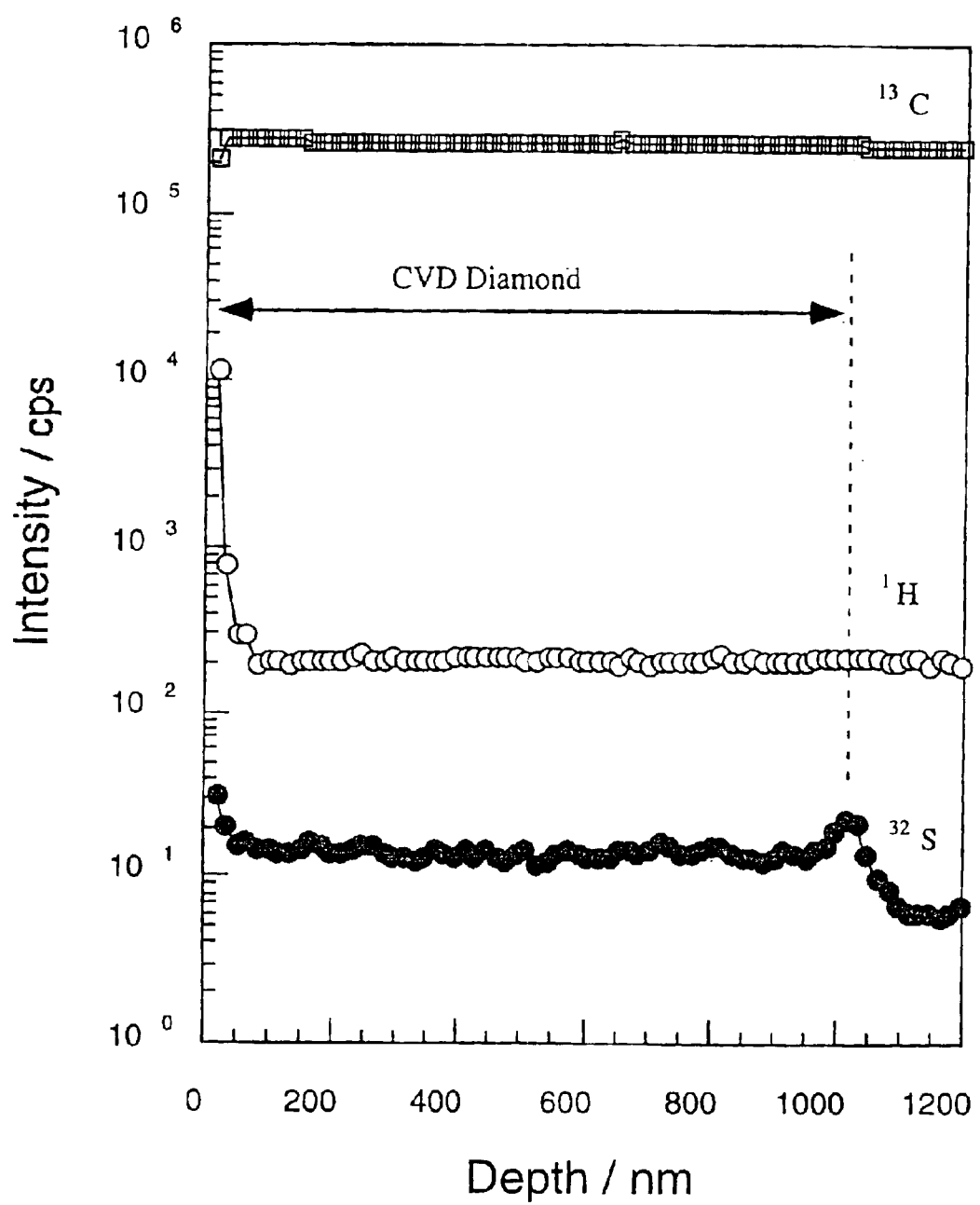

In the drawings:
With respect to the second object:

FIG. 1 is a diagrammatic view showing a substrate surface state according to a substrate pre-treatment in an embodiment illustrated;

FIG. 2 is an inter-atomic force microscopic (AMF) photograph of a substrate surface configuration according to the substrate pre-treatment in the embodiment illustrated;

FIG. 3 is an optical-microscopic photograph comparing the surface configuration of a substrate subjected, and that of a substrate not subjected, to the substrate pre-treatment in the embodiment illustrated, each of which substrates thereafter had an epitaxial growth of sulfur-doped, n-type semiconductor diamond thereon;

FIG. 4 is a schematic view of a microwave plasma CVD apparatus used in the embodiment illustrated; and FIG. 5 is a listing showing conditions for sulfur-doped, n-type semiconductor diamond epitaxial growth in the embodiment illustrated; With respect to the first object:

FIG. 6. is a diagram showing the temperature dependency of the carrier concentration of sulfur-doped, n-type semiconductor diamond in the embodiment illustrated;

FIG. 7 is a diagram showing the temperature dependency of the mobility according to measurement of the Hall coefficient, of sulfur-doped, n-type semiconductor diamond in the embodiment illustrated;

FIG. 8 is a diagram showing the temperature dependency of the mobility according to measurement of the Hall coefficient, of sulfur-doped, n-type semiconductor diamond caused to grow at a substrate temperature of 780° C. in the embodiment illustrated;

FIG. 9 is a diagram comparing the mobility of sulfur-doped, n-type semiconductor diamond of the embodiment illustrated and that of a conventional phosphorus doped, n-type semiconductor diamond;

FIG. 10 is a diagram showing the Raman'spectrum of sulfur-doped, n-type semiconductor diamond of the embodiment illustrated;

FIG. 11 is a diagram showing the spectrum of a light emission by free excitons and that by bound excitons in sulfur-doped, n-type semiconductor diamond;

FIG. 12(a) shows a secondary electron microscopic (SEM) image of crystallinity of sulfur-doped, n-type semiconductor diamond of the embodiment illustrated;

FIG. 12(b) shows a reflection electron diffraction (RHEED) pattern of crystallinity of sulfur-doped, n-type semiconductor diamond of the embodiment illustrated; and FIG. 13 is a diagram showing an atomic percentage profile on secondary ion mass spectrometric analysis of sulfur-doped, n-type semiconductor diamond of the embodiment illustrated.

BEST MODES FOR CARRYING OUT THE INVENTION

Hereinafter, the present invention for a method of making an n-type semiconductor diamond will be described in detail with respect to suitable embodiments thereof with reference to the drawing figures.

It should be noted at this point that while any form of energy, electrical, thermal and light may here be used singly or in combination depending on how to activate a raw material or feed stock gas to cause an n-type semiconductor diamond to grow, the embodiment being illustrated makes use of an epitaxial growth process by a microwave plasma CVD (chemical vapor deposition, or chemical gas phase growth) that utilizes electrical and thermal energies.

Mention is first made of a preliminary treatment for a substrate on which to have epitaxial growth in the embodiment illustrated. This substrate pre-treatment is featured by (1) mechanically polishing a diamond (100) face oriented substrate surface so that its face normal is inclined at an angle of 1.5 to 6 degrees with respect to its <100> direction in a plane made either by its <100> and <010> directions or by its <100> and <001> directions to form an inclined substrate, (2) surface smoothening this inclined substrate by exposing it to hydrogen plasma.

(1) Mechanical polishing is carried out using diamond grains of a grain size of not greater than 0.5 μm.

(2) Surface smoothening makes use of a microwave plasma apparatus to be described in detail later and operating at a microwave output of 200 to 1200 W at 2.45 GHz and is performed under a hydrogen pressure of 10 to 50 Torr for a period of 0.5 to 5 hours for the substrate heated at a substrate temperature of 700 to 1200° C. Alternatively, the surface smoothening treatment may be performed by exposure to an oxygen flame such as acetylene combustion flame.

FIG. 1(a) shows in a diagrammatic cross sectional view a state of the substrate prepared by the above-mentioned pre-treatment, viz. by mechanical polishing effected such that the face normal of the diamond (100) substrate is inclined at any angle in a range between 1.5 and 6 degrees with respect to its <100> direction in a plane formed either by its <100> and <010> directions or by its <100> and <001> directions.

As shown in the Figure, the inclined substrate surface has its enveloping surface with an angle (α) of inclination established at the time of mechanical polishing but as seen microscopically is extremely uneven and irregular in atomic order in size.

Figure 1B:
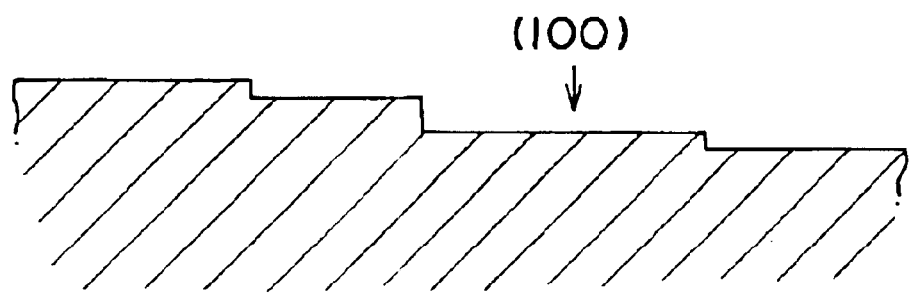

FIG. 1(b) shows in like diagrammatic cross sectional view a state of the substrate surface after it has been smoothened by the surface smoothening treatment, e.g., by exposing the inclined substrate's surface to hydrogen plasma as mentioned above.

As shown in this Figure, the substrate surface is smoothened in atomic order in size by the surface smoothening treatment and also seen to have the (100) faces lying stepped in the order of atomic layers in size.

Figure 2A:
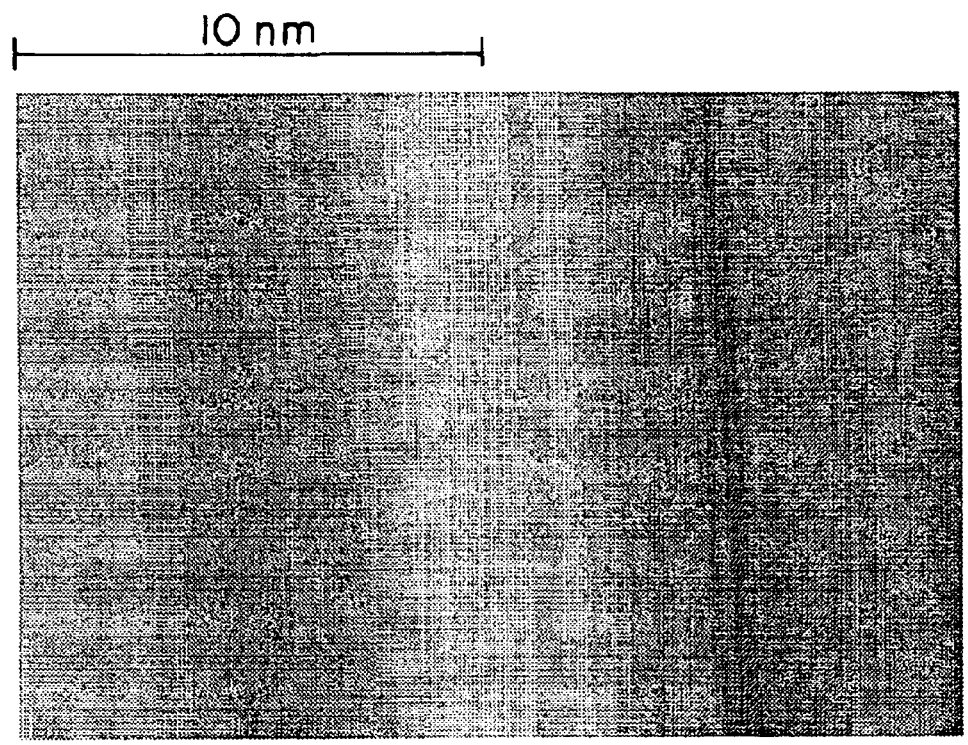

FIG. 2(a) is a photograph by an interatomic force microscope (AFM) of the surface of the inclined substrate prepared by mechanical polishing (1) above.

From this Figure, it is seen that in the surface there exist a large number of differences in level and also a large number of fine and elongate scored traces made by the abrasive particles used in the mechanical polishing.

To wit, the surface of an inclined substrate prepared by the step (1) above has its envelope surface with a given angle of inclination established at the time of mechanical polishing as shown in FIG. 1(a) but as seen microscopically is very much uneven and irregular in the atomic order in size.

Figure 2B:
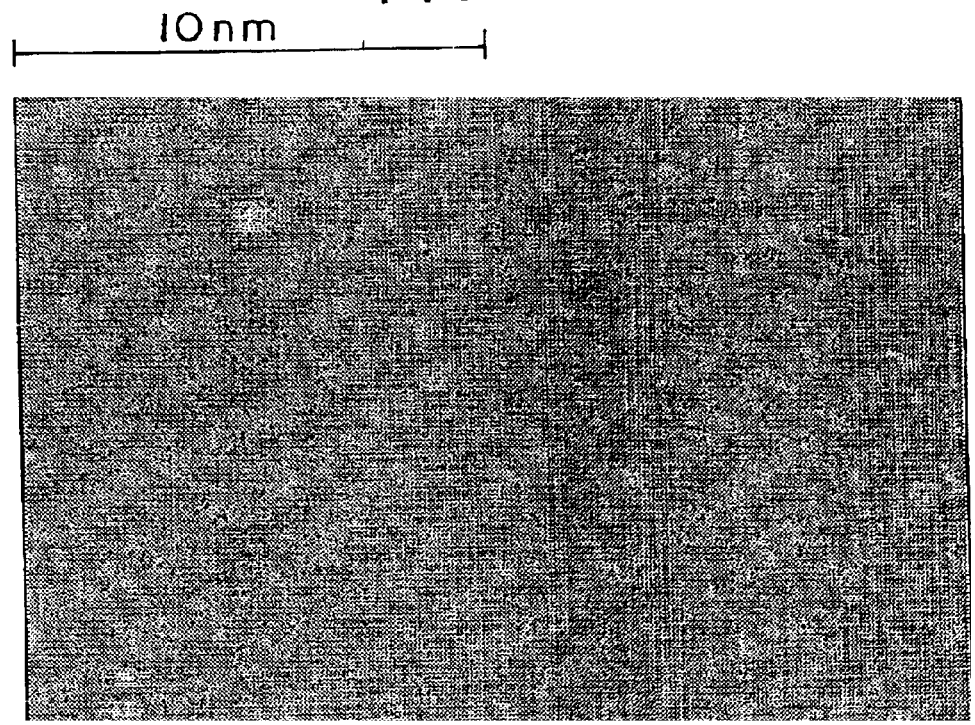

FIG. 2(b) is a photograph by AFM of this inclined substrate's surface after it had the smoothening treatment (2) mentioned above.

From this Figure, it is found that the differences in level seen in FIG. 2(a) are lessened and the fine and elongate scored traces by the abrasive grains are eliminated as well so that the surface is made even on an atomic level in size. To wit, the surface smoothening treatment (2) as diagrammatically shown in FIG. 1(b) does smoothen the substrate surface in the atomic order and also change the (100) face to make such face surfaces lying stepped consecutively each in the order of an atomic layer.

Figure 3A:
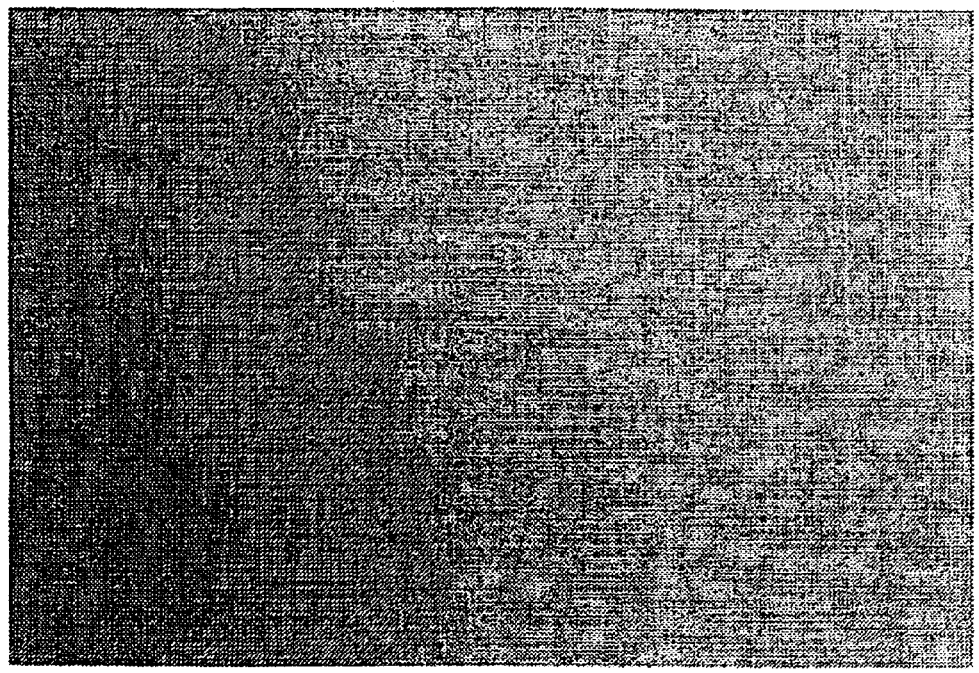
Figure 3B:
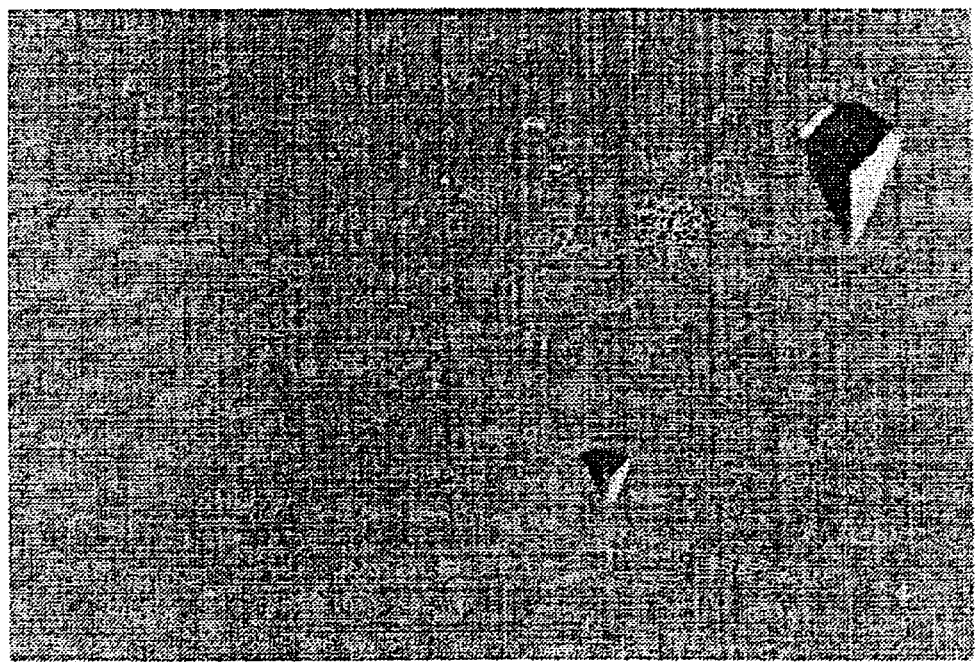

FIG. 3(a) is a photograph by the optical microscope of the surface of a thin film of n-type diamond of a thickness of 1 μm caused to grow epitaxially by the microwave plasma CVD process on the substrate pre-treated (1) and (2) as above, the process using a raw material gas containing methane and hydrogen sulfide gases diluted with hydrogen gas. FIG. 3(b) is an optical microscopic photograph of an n-type diamond thin film made to epitaxially grow (under the same conditions as above) on the (100) substrate neither (1) nor (2) pretreated.

As is seen in FIG. 3(a), it is found that a substrate pre-treated by (1) and (2) above allows a thin film of n-type diamond to epitaxially grow thereon whose surface is flat and even in the atomic order. This n-type diamond thin film also exhibits an extremely high perfect crystallinity on measurements that assess crystallinity, e.g., measurement of the temperature dependency of the mobility, observation of light emission by excitons and measurement of the Raman spectrum, as will be described later in greater details.

On the other hand, as is seen in FIG. 3(b), it is found that the surface of an n-type diamond thin film made to epitaxially on a substrate omitting pre-treatments (1) and (2) above has growth of a triangular twin crystal and is also quite irregular reflecting the polishing traces. Further, this n-type diamond thin film shows, also on measurements that assess crystallinity, no such high perfect crystallinity as with the n-type diamond thin film made to grow on the substrate pre-treated by (1) and (2) above.

Figure 1C:
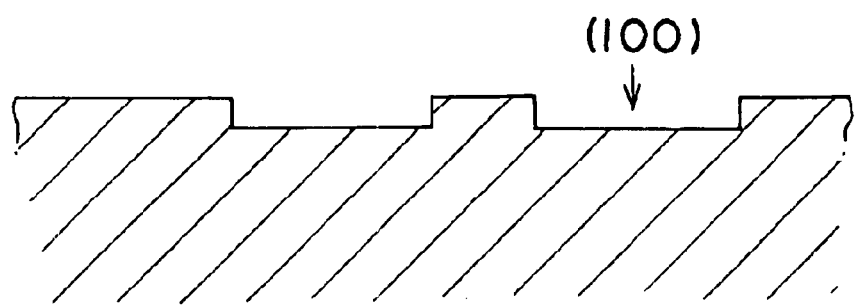

Further, a substrate if mechanically polished parallel to the (100) face, i.e., at an angle of inclination of 0 degree, and its surface is then smoothened in pre-treatment (2), gives rise to a surface having (100) faces, each in the order of an atomic layer, connected one to the next rising and sinking alternately as shown in FIG. 1(c). If such a surface is used to allow an n-type diamond thin film to epitaxially grow thereon, then the resulting surface of the thin film will have a twin crystal developed as shown FIG. 3(b) and will also yield no favorable result as in the above-mentioned measurements assessing its crystallinity.

As explained above, the pre-treatment of a substrate for epitaxial growth thereon by (1) mechanically polishing the substrate so that its diamond (100) face normal is inclined at an angle of 1.5 to 6 degrees with respect to its <100> direction in a plane made either by its <100> and <010> directions or by its <100> and <001>directions to form an inclined substrate, and then (2) exposing this inclined substrate to a hydrogen plasma to smoothen the substrate surface permits the substrate surface to be made even in an atomic order and to lie stepped contiguously each in the order of an atomic layer. And, when made to epitaxially grow on this substrate, an n-type diamond is allowed to form thereon that is excellent in crystallinity.

An explanation is next given in respect of the microwave plasma CVD apparatus used in the embodiment illustrated. FIG. 4 is a diagrammatic view of the microwave plasma CVD apparatus used in the embodiment illustrated.

Referring to FIG. 4, the microwave plasma CVD apparatus used in the embodiment illustrated includes a microwave generating means 1, for example, of 2.45 GHz, a combined isolator and power monitor 3, a tubular reaction vessel 7 that is provided with a tuner 5 and in use is irradiated with microwaves, and a vacuum pump (not shown) for evacuating the tubular reaction vessel 7 to vacuum. Also included in the microwave plasma CDV apparatus are a gas supply line 9 for supplying the tubular reaction vessel 7 switchably with a mixture gas as the raw material gas and a purging gas. The apparatus further includes a plurality of optical windows 11, 11, a substrate holder 13 mounted in the tubular reaction vessel, and a temperature control system 17 for heating or cooling a substrate 15 mounted on the substrate holder 13. With the gas supplied onto substrate 15, the apparatus is designed to produce a microwave plasma. Also, an optical pyrometer is used to monitor the substrate temperature.

An explanation is next given in respect of conditions for the epitaxial growth of an n-type semiconductor diamond by the microwave plasma CVD process. These growth conditions vary depending on raw material, temperature, pressure, the gas rate of flow, the added amount of an impurity and substrate area and so on.

FIG. 5 is a listing of the homo-epitaxial growth conditions for sulfur-doped semiconductor diamond in the embodiment illustrated. In the explanation referring to FIG. 5, while in the embodiment illustrated a mixture gas or gaseous mixture of methane, hydrogen sulfide and hydrogen is used for the raw material gas, use may be made of a gaseous mixture of a volatile hydrocarbon compound such as alkane or alkene, a sulfur compound gas and hydrogen as well for the raw material gas. Here, use is made of a hydrocarbon as the source of supply of carbon as the principal constituent of diamond, of a sulfur compound as the source of supply of donor atoms and of hydrogen as the source of supply of carriers.

While use may be made, for example, of methane, ethane or propane for the alkane, and of ethylene or propylene for the alkene, it is highly desirable that use be made of methane for the volatile hydrocarbon compound since methane can easily limit supply of carbon as the constituent of diamond to minimum.

For the sulfur compound, while an inorganic sulfur compound such as $H_2S$ and $CS_2$ and an organic sulfur compound such as lower alky mercaptan can be listed, hydrogen sulfide is most preferable.

It follows, therefore, that for the gaseous mixture, use should preferably be made of a combination of methane, hydrogen sulfide and hydrogen, desirably with a methane concentration of 0.1 to 5%, preferably 0.5 to 3.0%, and with a hydrogen sulfide concentration of 1 to 2000 ppm, preferably 5 to 200 ppm.

In the embodiment illustrated, methane has a concentration of 1% and hydrogen sulfide has a concentration of 10 to 100 ppm. For the carrier concentration that increases as the hydrogen sulfide concentration is increased, 50 ppm is most preferably because in the above range of concentration of hydrogen sulfide the mobility becomes maximum when hydrogen sulfide is added in an amount of 50 ppm.

For the total gas rate of flow that depends on the scale of the apparatus such as the volume of the tubular reaction vessel, the flow rate of the gasses supplied and the volume of the exhaust gases, use is made of 200 ml/min in this embodiment.

While the gas rates of flows are controlled using a mass flow controller so as to correspond to the particular gas kinds, the amount of addition of hydrogen sulfide is established, for example, by using a mixture gas bomb containing 100 ppm of hydrogen sulfide and the balance hydrogen, diluting the mixture gas with carrier hydrogen and having the mass flow controller control the resultant gaseous mixture so that a predetermined proportion of the addition is attained.

In the embodiment illustrated, use is made of a mixture gas bomb containing 100 ppm of hydrogen sulfide and the balance hydrogen. In the embodiment illustrated where the concentration of hydrogen sulfide is set at 50 ppm, if the total rate of flow is set at 200 ml/min, flow of the carrier hydrogen gas at a rate of 100 ml/min by flow of the mixture gas of 100 ppm hydrogen sulfide and the balance hydrogen permits establishing the concentration of hydrogen sulfide at 50 ppm in the aggregate.

For the atmospheric pressure that generally lies in the range of 30 to 60 Torr in the microwave plasma CVD process, use is made of 40 Torr in the embodiment illustrated. The microwave discharge is a glow discharge that can be sustained at a relatively high pressure.

For the temperature at which to precipitate diamond that generally ranges between 700 and 1100° C., use is made of 830° C. in the embodiment illustrated.

While use is made here of Ib diamond for the diamond that makes up the substrate, the diamond is not limited to this type but may be of Ia or II type. Also, while the face having homo-epitaxial diamond growth produced thereon is the (100) face in the embodiment illustrated, it is not limited so but may, for example, be the (111) or (110) face as well.

An explanation is next given in respect of a process of making an n-type semiconductor diamond in accordance with the embodiment illustrated.

First in the pre-treatment of a substrate for having epitaxial growth thereon, diamond grains of a grain size not more than 0.5 μm are used to give the substrate an inclined surface by mechanical polishing. In so doing, a diamond (100) face oriented substrate surface is mechanically polished so that its face normal is inclined at an angle in a range between 1.5 degree and 6 degrees with respect to its <100> direction in a plane made by either its <100> and <010> directions or its <100> and <001> directions. The inclined surface so given of the substrate (inclined substrate) is made even using the aforementioned microwave plasma apparatus by exposing therein this substrate surface to a hydrogen plasma of 2.45 GHz having a microwave output of 200 to 1200 W under a hydrogen pressure of 10 to 50 Torr with a substrate temperature of 700 to 1200° C. for a treatment period of 0.5 to 5 hours. It should be noted here that such surface smoothening treatment can also be performed by exposure to an oxidizing flame such as an acetylene combustion flame as well.

The surface smoothened substrate, then after treatment by cleaning, is mounted on a substrate holder in the vacuum vessel, and nitrogen and oxygen therein is removed by repeating a hydrogen purging from the gas supply line several times. This is followed by heating the substrate holder to raise its surface temperature controllably to 830° C. and controlling its atmospheric pressure at 40 Torr. Here, the surface temperature of the substrate is measured by an optical pyrometer.

The gas supply line is then switched to replace the purging hydrogen gas with a gas mixture of 1% methane and 50 ppm hydrogen sulfide diluted with hydrogen, which is introduced into the tubular reaction vessel to flow therethrough at a flow rate of 200 ml/min. Then, effecting a microwave discharge under the controlled atmospheric pressure of 40 Torr brings about a plasma above the substrate. With a plasma flow supplied onto the substrate, a thin diamond film is allowed to epitaxially grow thereon.

When the film has grown to a given thickness, the gas supply line is switched to resume the hydrogen purging position, the microwave discharge is terminated, and the substrate is refrained from heating or cooled.

After returning to the room temperature, the diamond substrate is taken out of the substrate holder in the tubular reaction vessel that has returned to its normal pressure.

A thin diamond film so made and formed with electrodes has been found to show the ohmic characteristic at measuring temperatures of 250 to 550 K.

All the diamond crystal film specimens so made have been found to show a negative Hall coefficient at measuring temperatures of 250 to 550 K and a mobility at the room temperature that is as high as 580 cm$^2$/Vs. They also have a clear Kikuchi pattern observed in their reflection electron diffraction (RHEED), showing that the crystalline films are extremely high in crystallinity.

As is apparent from the above explanation, the n-type semiconductor diamond making method of the embodiment illustrated permits providing an n-type semiconductor diamond that is high in mobility and excellent in crystallinity.

An explanation is next given in respect of properties of an n-type semiconductor diamond made in the manner described.

FIG. 6 is a diagram showing the temperature dependency of the carrier concentration of an n-type semiconductor diamond according to the embodiment illustrated.

As can be seen from FIG. 6, the diamond has the carrier concentration that increases from $10^{12}$ to $10^{16}$ cm$^{-3}$ as the temperature is raised, and has an electrical conductivity of $1.3 \times 10^{-3}$ $\Omega^{-1}$cm$^{-1}$. I can be seen from this Figure that the carrier density is wholly exponentially dependent on the inverse of the temperature, thus indicating that the carriers are furnished from only a single donor level. It is found from FIG. 6 that an activation energy of the donor level is 0.38 eV.

It follows, therefore, that the present invention provides an n-type semiconductor diamond in which sulfur (S) atoms form a single donor level with the activation energy of 0.38 eV.

FIG. 7 is a diagram showing the temperature dependency of the mobility derived from measurement of the Hall coefficient of an n-type semiconductor diamond in the embodiment illustrated.

All the specimens have been found to show a negative Hall coefficient at measuring temperatures of 250 to 550 K.

As is apparent from FIG. 7, the carrier concentration and the mobility at the room temperature are $1.4 \times 10^{13}$ cm$^{-3}$ and 580 cm$^2$/Vs, respectively.

FIG. 8 is a diagram showing the temperature dependency of the mobility derived from measurement of the Hall coefficient of an n-type semiconductor diamond that is grown at a temperature of 780° C. While the growth conditions are the same except the substrate temperature, the lower temperature reduces the amount of introduction of sulfur into the crystal.

In the example shown in FIG. 8, it is shown that the mobility is still as high as 980 cm$^2$/Vs, indicating that the n-type semiconductor diamond of the present invention is considerably high in mobility even with the doped amount of sulfur so reduced.

It should be noted further that while the electron mobility of the IIa-type diamond is estimated to be about 2000 cm$^2$V$^{-1}$s$^{-1}$, the method of manufacture according to the embodiment illustrated that permits preparations with excellent crystallinity permits the use of a substrate composed of the IIa-type diamond to achieve a mobility even in the order of $10^3$ cm$^2$V$^{-1}$s$^{-1}$.

FIG. 9 is a diagram that compares the sulfur (S) doped n-type semiconductor diamond with the conventional phosphorus (P) doped n-type semiconductor diamond with respect to the mobility.

In FIG. 9, data marked by □ and ○ are of S-doped n-type semiconductor diamond specimens produced in accordance with the present invention at the growth temperatures of 780° C. and 830° C., respectively; and data indicated by the dark circle and the chain line are of the conventional P-doped n-type semiconductor diamond.

The conventional P-doped semiconductor diamond has a mobility at the room temperature in the order of 10 cm$^2$/Vs and 30 cm$^2$/Vs at the highest. See Diamond and Related Materials 7 (1998) 540–544, S. Koizumi et al.

In comparison, an S-doped n-type semiconductor diamond of the present embodiment illustrated as mentioned above has a mobility as high as about 600 cm$^2$/Vs, and thus exhibits a extremely high mobility.

Furthermore, an S-doped n-type semiconductor diamond as made by a method of making according to the present invention exhibits the mobility that is $T^{-3/2}$-dependent, as opposed to the temperature dependency, the temperature characteristic of the mobility found where the crystal defects are abundant.

This temperature characteristic indicates that for the carrier scattering process, what are due to phonons is controlling, and is observable only with a single crystal that is high in crystallinity perfectness. It is seen, therefore, that the source of the carriers is not such as crystal defects but is the dopant atoms, demonstrating that the diamond has a perfect crystallinity usable for a semiconductor device.

FIG. 10 is a diagram showing the Raman spectrum of an n-type semiconductor diamond of the present embodiment. As is apparent from FIG. 10, there is seen no peak other than the peak at the wave number of 1333 cm$^{-1}$, whose half width is as very narrow as about 2.6 cm$^{-1}$. It is thus shown that the n-type semiconductor diamond of the present invention is very high in crystallinity. Although not shown, the wave number of an n-type semiconductor diamond produced by epitaxial growth on the substrate without having the pre-treatment is about 6 cm$^{-1}$.

FIG. 11 is a diagram showing the spectrum of a light emission by free excitons and that of a light emission by bound excitons. For the n-type semiconductor diamond, it is apparent from FIG. 11 that the free exciton light emission (FE) and the bound exciton light emission (BE) are observed at 235 nm and 238 nm, respectively. This indicates, among others, that the doped ions are present at lattice points of the diamond lattice and moreover form a perfect donor level within the band gap thereof. On the other hand, for the n-type semiconductor diamond formed by epitaxial growth on the substrate not subjected to the pre-treatment is observed neither free exciton light emission nor band exciton light emission.

FIGS. 12(a) and 12(b) show a secondary electron microscopic (SEM) photograph and a reflection electron diffraction (RHEED) pattern, respectively. As is apparent from FIG. 12(a), the n-type semiconductor diamond in the present embodiment has an extremely smooth surface and as is so from FIG. 12(b), it exhibits a highly distinct and clear Kikuchi pattern, indicating that the same is extremely high in crystallinity.

FIG. 13 is a diagram showing a profile of the atomic percentages of the n-type semiconductor diamond in the present embodiment, derived from secondary ion mass spectrometric analysis (SIMS). It can be seen from FIG. 13 that the n-type semiconductor diamond is doped with sulfur (S) at a constant percentage, obviously with the sulfur (S) atoms at a concentration at least more than $10^{13}$ cm$^{-3}$ as a limit of detection by SIMS.

From the foregoing description, it is evident that an n-type semiconductor diamond made by the embodiment illustrated possesses the n-type conductivity, the characteristic found where carriers are supplied from a single donor level, and has few crystal defects and a large mobility. Accordingly, it can well be combined with the conventional p-type semiconductor preparation technique to provide a pn-junction that is excellent in properties.

Although the present invention has hereinbefore been set forth with respect to certain illustrative forms of embodiments thereof, it will readily be appreciated to be obvious to a person skilled in the art that many alternations thereof, omissions therefrom and additions thereto can be made without departing from the essences of scope of the present invention. Accordingly, it should be understood that the invention is not intended to be limited to the specific forms of embodiment thereof set forth below, but to include all possible forms of embodiment thereof that can be made within the scope with respect to the features specifically set forth in the appended claims and encompasses all the equivalents thereof.

Industrial Applicability

As has been set forth in the foregoing description, an n-type semiconductor diamond and a method of making the same according to the present invention make possible industrial manufacture of semiconductor electronic devices by semiconductor diamond thin films, and make it possible to realize manufacture of such devices as a small, high power device, a high output, high frequency device and a high temperature operating device.

What is claimed is:

1. An n-type semiconductor diamond, characterized by a making method comprised of:

mechanically polishing a (100) diamond surface to make it in an inclined diamond substrate;

subjecting a surface of said inclined diamond substrate to a hydrogen plasma treatment to make said substrate surface to consist of steps each in the order of an atomic layer; and subjecting said substrate surface consisted of steps each in the order of an atomic layer to an exited raw material gas made of a volatile hydrocarbon compound, a sulfur compound and a hydrogen gas by a microwave plasma to cause n-type semiconductor diamond to grow epitaxially on said surface consisted of steps each in the order of an atomic layer, wherein said n-type semiconductor has a single donor level of 0.38 eV, which is sufficient to allow operation of said n-type semiconductor diamond as p-n junction device.

2. A method of making an n-type semiconductor diamond, characterized in that it comprises:

mechanically polishing a diamond substrate to make it in an inclined diamond substrate, which is formed by mechanically polishing a diamond (100) face oriented substrate so that its face normal is inclined at an angle between 1.5 and 6 degrees with respect to its <100> direction in a plane made by either its <100> and <010> directions or its <100> and <001> directions;

subjecting a surface of said inclined diamond substrate to a hydrogen plasma treatment to make it even; and exciting a raw material gas made of a volatile hydrocarbon compound, a sulfur compound and a hydrogen gas by a microwave plasma while maintaining at a given temperature said substrate surface smoothened as aforesaid to cause an n-type semiconductor diamond to grow epitaxially on said smoothened substrate.

3. A method of making an n-type semiconductor diamond asset forth in claim 2, characterized in that said diamond substrate is a diamond (100) face oriented substrate.

4. A method of making an n-type semiconductor diamond as set forth in claim 2, characterized in that said hydrogen plasma treatment comprises a treatment of exposing said inclined substrate to the hydrogen plasma of a hydrogen pressure of 10 to 50 Torr and a microwave output of 200 to 1200 W at a substrate temperature of 700 to 1200° C. for a period of 0.5 hours to 5 hours, thereby to make even said substrate surface to consist of steps each in the order of an atomic layer.

5. A method of making an n-type semiconductor diamond as set forth in claim 2, characterized in that said given substrate temperature is between 700 and 1100° C.

6. A method of making an n-type semiconductor diamond as set forth in claim 5, characterized in that said given substrate temperature is 830° C.

* * * * *